(12) United States Patent
Kwon et al.

(10) Patent No.: US 10,700,311 B2
(45) Date of Patent: Jun. 30, 2020

(54) DISPLAY DEVICE AND MANUFACTURING METHOD FOR THE SAME

(71) Applicant: Samsung Display Co., Ltd., Yongin-si, Gyeonggi-Do (KR)

(72) Inventors: Seung Wook Kwon, Yongin-si (KR); Young Seung Cho, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/191,569

(22) Filed: Nov. 15, 2018

(65) Prior Publication Data
US 2019/0280248 A1 Sep. 12, 2019

(30) Foreign Application Priority Data
Mar. 9, 2018 (KR) .................... 10-2018-0028140

(51) Int. Cl.
| | |
|---|---|
| *H01L 51/56* | (2006.01) |
| *H01L 51/00* | (2006.01) |
| *H01L 51/52* | (2006.01) |
| *H01L 27/32* | (2006.01) |
| *G09G 3/3233* | (2016.01) |
| *G09F 9/30* | (2006.01) |

(52) U.S. Cl.
CPC .............. *H01L 51/56* (2013.01); *G09F 9/301* (2013.01); *G09G 3/3233* (2013.01); *H01L 27/3246* (2013.01); *H01L 51/0097* (2013.01); *H01L 51/5246* (2013.01); *H01L 51/5253* (2013.01)

(58) Field of Classification Search
CPC . H01L 51/56; H01L 51/0097; H01L 51/5246; H01L 51/5253; H01L 27/3246; G09F 9/301; G09G 3/3233
USPC .......................................................... 257/40
See application file for complete search history.

(56) References Cited

U.S. PATENT DOCUMENTS

| | | | |
|---|---|---|---|
| 9,793,512 B2 | 10/2017 | Choi et al. | |
| 2014/0299848 A1* | 10/2014 | Kim | .................... H01L 51/0097 257/40 |
| 2016/0351859 A1 | 12/2016 | Ko et al. | |
| 2017/0042047 A1* | 2/2017 | Oh | .......................... G09G 3/20 |
| 2017/0266946 A1 | 9/2017 | Porneala et al. | |
| 2017/0271616 A1* | 9/2017 | Choi | ................... H01L 51/5253 |

FOREIGN PATENT DOCUMENTS

| | | |
|---|---|---|
| KR | 10-2015-0033780 A | 4/2015 |
| KR | 10-2016-0141929 A | 12/2016 |
| KR | 10-2017-0109724 A | 10/2017 |

\* cited by examiner

*Primary Examiner* — Tong-Ho Kim
(74) *Attorney, Agent, or Firm* — Kile Park Reed & Houtteman PLLC

(57) ABSTRACT

An embodiment relates to a display device and a manufacturing method of the display device. The display device includes a flexible substrate including a display region and a non-display region outside the display region, and a flexible substrate disposed on the flexible substrate of the display region, wherein a groove is provided on a back surface of the flexible substrate.

20 Claims, 5 Drawing Sheets

DISPLAY DEVICE AND MANUFACTURING METHOD FOR THE SAME

CROSS-REFERENCE TO RELATED APPLICATION

Korean patent application 10-2018-0028140 filed on Mar. 9, 2018 in the Korean Intellectual Property Office, and entitled: "Display Device and Manufacturing Method for the Same," is incorporated by reference herein in its entirety.

BACKGROUND

1. Field

Embodiments relate to a display device and a manufacturing method of the display device, and more particularly, to a display device having flexibility and a manufacturing method of the display device.

2. Description of the Related Art

In recent years, flat panel display devices have been actively researched and developed. Since the flat panel display devices are thinner and lighter, their use range is expanding. In addition, since the flat panel display devices have recently become flexible, the flat panel display devices are easier to carry and the application targets are also increasing.

SUMMARY

Embodiments are directed to a display device including a flexible substrate including a display region and a non-display region, the non-display region being outside the display region, and a display unit on the flexible substrate of the display region. A groove is provided on a back surface of the flexible substrate.

The flexible substrate may be made of an organic material.

The flexible substrate may include at least one organic layer and at least one inorganic layer.

The display unit may includes a plurality of scan lines arranged in a first direction, a plurality of data lines arranged in a second direction intersecting the first direction, and a plurality of pixels connected to the plurality of scan lines and the plurality of data lines. Each of the plurality of pixels may include a light emitting element and a thin film transistor connected to the light emitting element.

An inner surface of the groove may be in a carbonized state produced by irradiating a laser beam onto the inner surface.

A depth of the groove may be 3% to 10% of a thickness of the flexible substrate.

The display device may further include a protecting film attached to the back surface of the flexible substrate. The protecting film may include an opening that exposes the groove.

Embodiments are also directed to a manufacturing method of a display device, the method including providing a first substrate, forming a second substrate including a display region and a non-display region on the first substrate, the non-display region being formed to be outside the display region, forming a display unit on the second substrate in the display region, forming a carbonized mark by irradiating a laser beam to a predetermined region of a back surface of the second substrate, separating the first substrate from the second substrate, attaching a protecting film to the back surface of the second substrate, and cutting the protecting film corresponding to both side portions of the carbonized mark. In cutting the protecting film, a cut portion of the protecting film is detached with the carbonized mark to form a groove on the back surface of the second substrate, and an opening is formed in the protecting film to expose the groove.

The first substrate may be a glass substrate.

The second substrate may be formed of an organic material.

The second substrate may be formed by laminating at least one organic layer and at least one inorganic layer.

Separating the first substrate may include irradiating the laser beam onto the back surface of the second substrate through the first substrate.

Forming the carbonized mark on the back surface of the second substrate may be performed after separating the first substrate.

The protecting film may include an adhesive layer adhered to the second substrate. The method further may include detaching and removing a portion of the adhesive layer corresponding to the groove with the carbonized mark.

The laser beam may have a wavelength of 300 nm to 400 nm

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
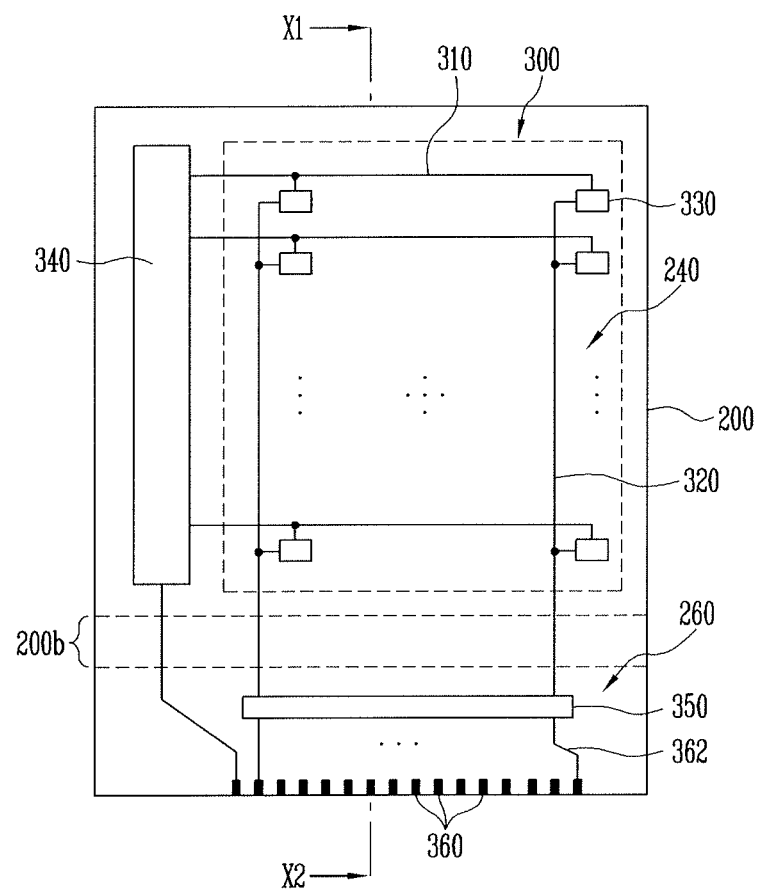
FIG. 1 illustrates a schematic plan view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
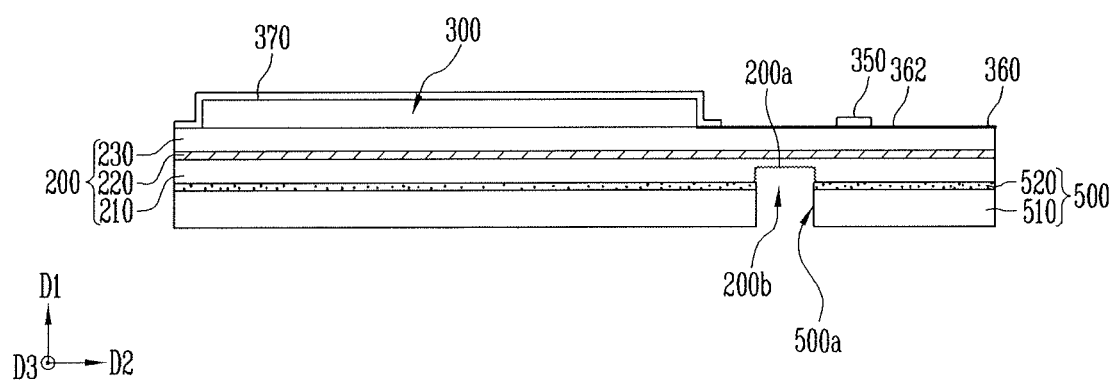
FIG. 2 illustrates a cross-sectional view of a display device according to an embodiment.

FIG. 1 illustrates a schematic plan view of a display device according to an embodiment, and FIG. 2 illustrates a cross-sectional view of the display device according to the embodiment, taken along the line X1-X2 of FIG. 1.

Referring to FIGS. 1 and 2, the display device may include a flexible substrate 200, a display unit 300 disposed on the flexible substrate 200 and displaying images, and a protecting film 500 disposed on a back surface of the flexible substrate 200, stacked in a first direction D1.

The flexible substrate 200 may include a display region 240 and a non-display region 260 outside the display region 240. The non-display region 260 may surround the display region 240 along a second direction D2 and a third direction D3.

The flexible substrate 200 may be made of an organic material, or may be composed of multiple layers including at least one organic layer and at least one inorganic layer. As an example, the flexible substrate 200 may have a structure in which a first organic layer 210, an inorganic layer 220, and a second organic layer 230 are sequentially stacked.

The display unit 300 may be disposed on the flexible substrate 200 in the display region 240. The display unit 300 may include a plurality of scan lines 310 arranged in a first direction, a plurality of data lines 320 arranged in a second direction intersecting the first direction, and a plurality of pixels 330 connected to the plurality of scan lines 310 and the plurality of data lines 320.

A scan driver 340 for supplying scan signals to the plurality of scan lines 310 and a data driver 350 for supplying data signals to the plurality of data lines 320 may be disposed on the flexible substrate 200 in the non-display region 260.

The scan driver 340 and the data driver 350 may be manufactured together on the flexible substrate 200 in the process of forming the display unit 300 or may be manufactured in the form of an integrated circuit (IC) chip and then mounted on the flexible substrate 200.

A pad unit 360 may be disposed on one side of the non-display region 260 to receive signals from outside. The pad unit 360 may be electrically connected to the scan driver 340 and the data driver 350 through wirings 362.

The display device according to the embodiment may include a control unit. The control unit may receive image signals from the outside, generate data signals, and provide the generated data signals to the data driver 350. The control unit may receive synchronous signals and clock signals from the outside, generate control signals, and provide the control signals to the scan driver 340 and the data driver 350.

Figure 3:
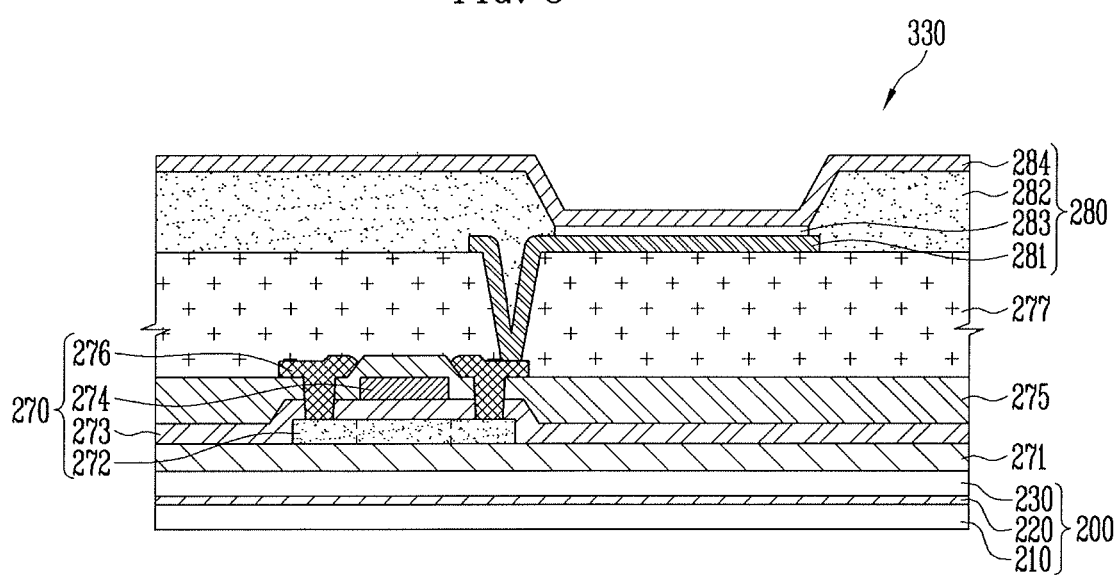
FIG. 3 illustrates a cross-sectional view for explaining a pixel shown in FIG. 1.

FIG. 3 illustrates a cross-sectional view for explaining one of the pixels 330 shown in FIG. 1.

Referring to FIG. 3, each of the plurality of pixels 330 may include a light emitting element 280 and a pixel circuit for driving the light emitting element 280. The pixel circuit may include a thin film transistor 270 for transmitting signals to the light emitting element 280 and a capacitor for maintaining the signals.

A current flowing through the light emitting element 280 may be controlled according to a data signal provided through the data line 320, such that each pixel 330 may emit light of a predetermined luminance corresponding to the data signal.

The light emitting element 280 may include, for example, an organic light emitting diode (OLED).

The light emitting element 280 may include a first electrode 281, a second electrode 284, and an organic thin film layer 283 interposed between the first electrode 281 and the second electrode 284.

The thin film transistor 270 may be disposed on the flexible substrate 200 in the display region 240. The thin film transistor 270 may include a semiconductor layer 272 providing source and drain regions and a channel region, a gate electrode 274 disposed on the semiconductor layer 272 in the channel region, and source and drain electrodes 276 electrically connected to the semiconductor layer 272 in the source and drain regions.

The display unit 300 configured as described above may be sealed with a sealing film 370.

The display device according to the embodiment may include a groove 200b that extends along the back surface of the flexible substrate 200 in the third direction D3. For example, the grooves 200b may be between the display region 240 and the data driver 350. The protecting film 500 may be attached to the back surface of the flexible substrate 200 including the groove 200b.

The protecting film 500 may include a base film 510 and an adhesive layer 520. The base film 510 may be attached to the flexible substrate 200 by the adhesive layer 520. An opening 500a may be formed in the protecting film 500 such that the groove 200b is exposed.

A predetermined carbonized mark 200a may remain on an inner surface of the groove 200b with an irregular surface due to carbonization. A depth of the groove 200b may be, for example, about 3% to 10% of a total thickness of the flexible substrate 200 in the first direction D1.

Embodiments will now be described in detail with reference to a manufacturing method of the display device according to the embodiments.

FIGS. 4A to 4F illustrate cross-sectional views of stages of a manufacturing method of the display device according to the embodiment. FIGS. 4A to 4F illustrate cross-sections taken along the line X1-X2 in FIG. 1.

Figure 4A:
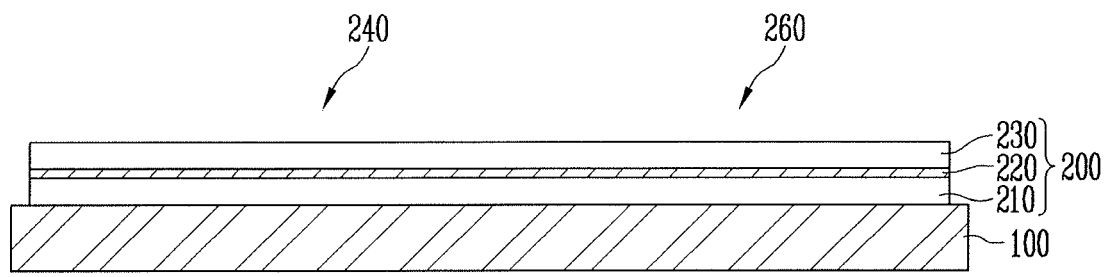
FIGS. 4A to 4F illustrate cross-sectional views depicting stages of a manufacturing method of a display device according to an embodiment.

Referring to FIG. 4A, a first substrate 100 may be provided as a supporting substrate. The first substrate 100 may be a transparent substrate having thermal resistance, and may be, for example, a glass substrate.

The second substrate 200 may be formed on the first substrate 100.

The second substrate 200 may be a substrate of the display device. The second substrate 200 may include the display region 240 and the non-display region 260 outside the display region 240.

The second substrate 200 may be formed by depositing or coating the organic material on the first substrate 100, or may be formed into a multilayer structure by alternately depositing or coating at least one organic layer and at least one inorganic layer. As an example, the second substrate 200 may be formed by sequentially forming the first organic layer 210, the inorganic layer 220, and the second organic layer 230 on the first substrate 100.

The first organic layer 210 may be formed of polyethersulfone (PES), polyacrylate (PAR), polyether imide (PEI), polyether naphthalate (PEN), polyethylene terephthalate (PET), polyphenylene sulfide (PPS), polyallylate, polyimide (PI), or the like, as examples.

The inorganic layer 220 may be a barrier layer that blocks the penetration of foreign substances, moisture or outside air from the bottom. The inorganic layer 220 may include one or more materials selected from silicon nitride, aluminum nitride, zirconium nitride, titanium nitride, hafnium nitride, tantalum nitride, silicon oxide, aluminum oxide, titanium oxide, tin oxide, cerium oxide and silicon oxynitride (SiON).

The second organic layer 230 may be formed of the same material as the first organic layer 210 or one of the organic materials described above.

Figure 4B:
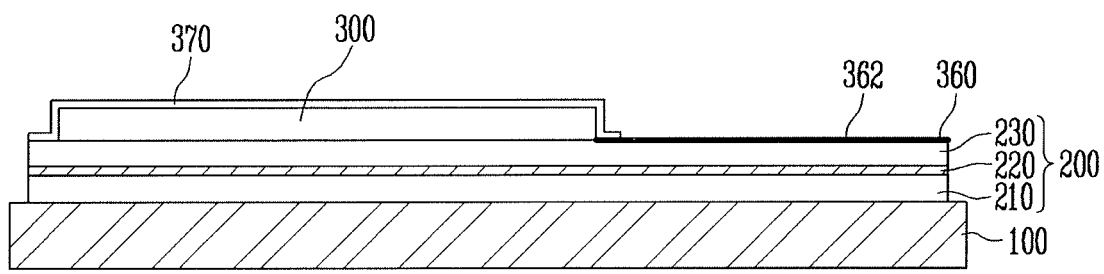

Referring to FIG. 4B, the display unit 300 may be formed on the second substrate 200 in the display region 240. The sealing film 370 may be formed on the second substrate 200 including the display unit 300.

The display unit 300 may include the plurality of scan lines 310 arranged in the first direction, the plurality of data lines 320 arranged in the second direction intersecting the first direction, and the plurality of pixels 330 connected to the plurality of scan lines 310 and the plurality of data lines 320.

Each of the plurality of pixels 330 may include the light emitting element 280 and the pixel circuit for driving the light emitting element 280. The pixel circuit may include the thin film transistor 270 to transmit signals to the light emitting element 280 and the capacitor for maintaining the signals.

As an example, the pixels 330 may be manufactured as follows.

Referring to FIG. 3, a buffer layer 271 may be formed on the flexible substrate 200.

The buffer layer 271 may prevent penetration of foreign substances, moisture, or outside air from the bottom, and may planarize the surface of the second substrate 200. The buffer layer 271 may be formed of silicon oxide, silicon nitride, silicon oxynitride, or the like.

The semiconductor layer 272 may be formed on the buffer layer 271 to provide the source and drain regions and the channel region.

The semiconductor layer 272 may be formed of amorphous silicon, polysilicon, oxide semiconductor, or the like.

The gate electrode 274 is formed on the semiconductor layer 272 in the channel region to be insulated from the semiconductor layer 272 by a gate insulating layer 273.

The plurality of scan lines 310, the wirings 362, and the pad unit 360 may be formed in the process of forming the gate electrode 274.

An interlayer insulating layer 275 may be formed on the gate insulating layer 273 including the gate electrode 274. A contact hole may be formed in the interlayer insulating layer 275 and the gate insulating layer 273 such that the semiconductor layer 272 in the source and drain regions is exposed. The source and drain electrodes 276 may be formed on the interlayer insulating layer 275 to be connected to the semiconductor layer 272 in the source and drain regions through the contact hole.

The plurality of data lines 320, the wirings 362, and the pad unit 360 may be formed in the process of forming the source and drain electrodes 276.

A planarization layer 277 may be formed on an upper portion including the thin film transistor 270 configured as described above.

A via hole may be formed in the planarization layer 277 so as to expose the source or drain electrode 276. The first electrode 281 may be formed on the planarization layer 277, for example, as an anode electrode to be connected to the source or drain electrode 276 through the via hole.

The first electrode 281 may include a reflective film formed of Ag, Mg, Al, Pt, Pd, Au, Ni, Nd, Ir, Cr or a compound thereof and a transparent or translucent conductive film formed on the reflective film. The transparent or semitransparent conductive film may be selected from indium tin oxide (ITO), indium zinc oxide (IZO), zinc oxide (ZnO), indium oxide ($In_2O_3$), indium gallium oxide (IGO), and aluminum zinc oxide (AZO).

A pixel defining film 282 may be formed on the planarization layer 277 including the first electrode 281. The pixel defining film 282 may be patterned to expose the first electrode 281 of a light emitting region to form an opening. The organic thin film layer 283 may be formed on the first electrode 281 in the opening.

The organic thin film layer 283 may include a hole injection layer, a hole transport layer, an organic light emitting layer, an electron transport layer, and an electron injection layer. The organic thin film layer may further include an auxiliary layer or an intermediate layer.

The second electrode 284 may be formed on the pixel defining film 282 including the organic thin film layer 283, for example, as a cathode electrode.

The second electrode 284 may be a transparent or semitransparent electrode and may be formed of a metal having a low work function including Li, Ca, LiF/Ca, LiF/Al, Al, Ag, Mg, and a compound thereof.

The sealing film 370 may be formed on a protecting film after forming the protecting film such that the light emitting element 280 constructed as described above may be protected from the outside air.

The sealing film 370 may have a laminated structure of organic layers and inorganic layers. The organic layers and the inorganic layers may be alternately laminated. An uppermost layer may be formed of an inorganic layer to prevent penetration of moisture or outside air. The inorganic layer may be formed so as to cover an outer surface of the organic layer.

Figure 4C:
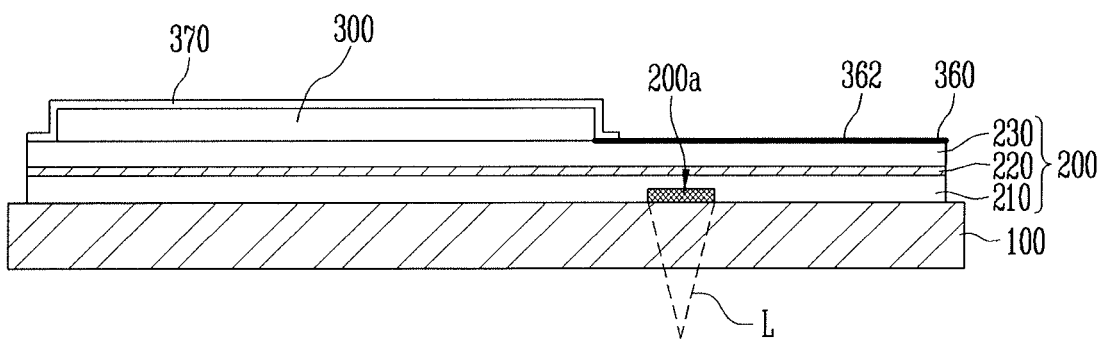

Referring to FIG. 4C, a laser beam L may be irradiated to a predetermined region on the back surface of the second substrate 200. A carbonized mark 200a may be formed by carbonizing a predetermined thickness of the second substrate 200 using the laser beam L.

The region irradiated with the laser beam L may be a region where the display device is bent. A size and a shape of the region may be variously changed as desired.

In some implementations, the region irradiated with the laser beam L may correspond to the non-display region 260 as shown in FIG. 4C. In some implementations, the region irradiated with the laser beam L may correspond to the display region 240.

The laser beam L may be an excimer laser, a solid state laser, or the like.

The laser beam L may be selected according to the material of the second substrate 200. For example, when the second substrate 200 includes polyimide (PI), the laser beam L having a wavelength of about 300 nm to 400 nm may be used such that energy of the laser beam L may be absorbed.

When the laser beam L having an energy of 190 mJ (megajoule) to 200 mJ is irradiated once, the carbonized mark 200a having a thickness of 0.3 μm to 0.4 μm may be formed. For example, the laser beam L may be irradiated 10 to 15 times to form the carbonized mark 200a to have a thickness of 3 μm to 5 μm.

The energy of the laser beam L and the number of times of irradiation may be varied as desired.

As an example, the carbonized mark 200a may be formed by the above-described manner to correspond to about 3% to 10% of the entire thickness of the second substrate 200.

Figure 4D:
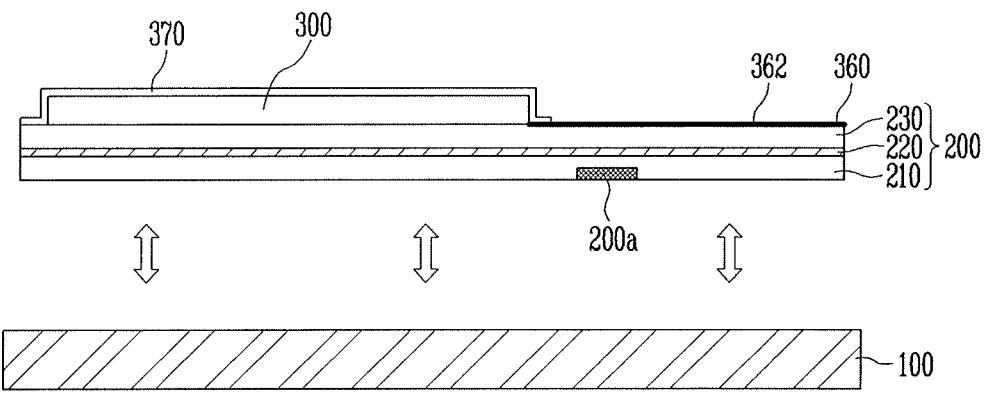

Referring to FIG. 4D, the first substrate 100 may be separated from the second substrate 200.

The first substrate 100 may be separated from the second substrate 200 by irradiating a laser beam onto the back surface of the second substrate 200 through the first substrate 100.

Although the carbonized mark may be formed on the back surface of the second substrate 200 by the irradiation of the laser beam, the carbonized mark being formed at this time may be insignificant. In some implementations, the energy of the laser beam or the number of times of irradiation may be controlled such that the carbonized mark is not formed on the back surface of the second substrate 200 or a state of the back surface of the second substrate 200 may not be affected.

In the above embodiment, after the carbonized mark 200a is formed on the back surface of the second substrate 200 as shown in FIG. 4C, the first substrate 100 is separated from the second substrate 200 as shown in FIG. 4D.

As another embodiment, the carbonized mark 200a may be formed on the back surface of the second substrate 200 after the first substrate 100 is separated from the second substrate 200.

Figure 4E:
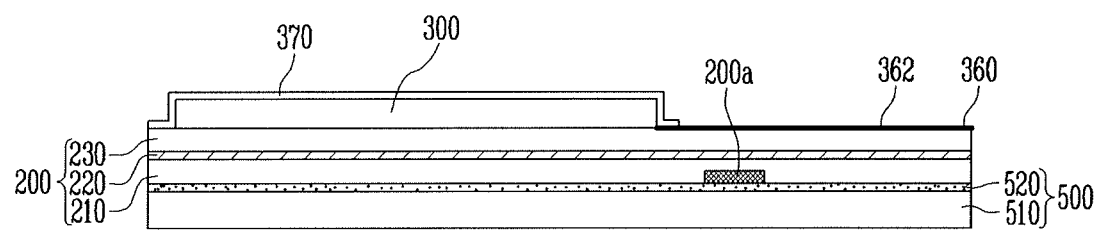

Referring to FIG. 4E, the protecting film 500 may be attached to the exposed back surface of the second substrate 200. The protecting film 500 may include the base film 510 and the adhesive layer 520. The base film 510 may be attached to the second substrate 200 by the adhesive layer 520. The protecting film 500 may protect the exposed back surface of the second substrate 200 and may support the second substrate 200 during bending.

Figure 4F:
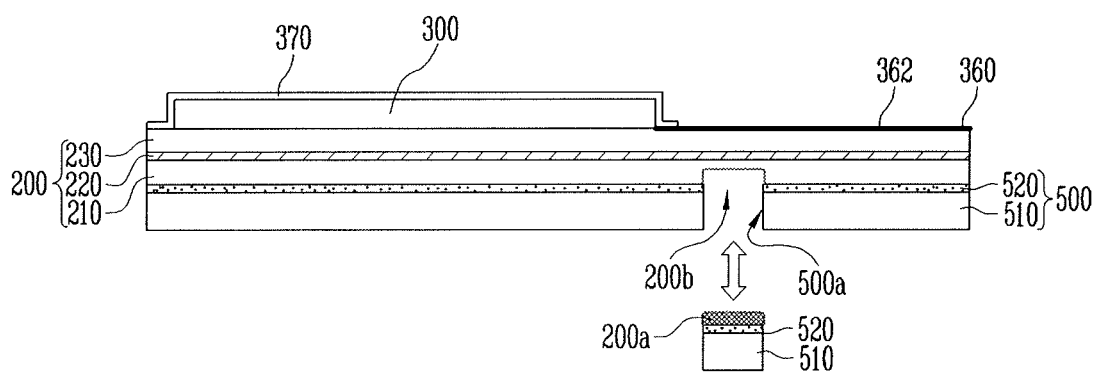

Referring to FIG. 4F, the protecting film 500 may be cut at locations corresponding to both sides of the carbonized mark 200a.

The laser beam L may be irradiated to locations of the protecting film 500 corresponding to both sides of the carbonized mark 200a. When the protecting film 500 is cut as described above, a cut portion of the protecting film 500 may be detached along with the carbonized mark 200a such that the groove 200b may be formed on the back surface of the second substrate 200. The opening 500a may be formed in the protecting film 500 such that the groove 200b is exposed.

The carbonized mark 200a may be formed by burning the second substrate 200 by the laser beam L. The carbonized mark 200a may include powder generated by carbonization. When the protecting film 500 is cut, most of the carbonized mark 200a may be separated from the second substrate 200 such that the base film 510 may be easily removed with the adhesive layer 520.

A predetermined portion of the carbonized mark 200a may remain on the inner surface of the groove 200b with the irregular surface due to carbonization.

In order to easily bend or fold the display device, the portion of the protecting film 500 corresponding to a bending region may be cut to form the opening 500a. In order to form the opening 500a, a process of cutting the protecting film 500 and a process of removing the adhesive layer 520 exposed through the opening 500a may be performed.

According to an embodiment, the process of forming the opening 500a may be simplified by forming the carbonized mark 200a on the back surface of the second substrate 200. The thickness of the second substrate 200 in the bending region may be reduced by forming the groove 200b on the back surface of the second substrate 200 corresponding to the opening 500a.

The depth of the groove 200b may be, for example, about 3% to about 10% of the total thickness of the flexible substrate 200. When the depth of the groove 200b is more than 3% of the total thickness of the flexible substrate 200, it may be less difficult to effectively reduce a radius of curvature. When the depth of the groove 200b is 10% or less of the total thickness of the flexible substrate 200, defects due to cracks or delamination in the elements formed on the flexible substrate 200 or the wires during bending, or breaking of the flexible substrate 200 may be avoided.

Figure 5:
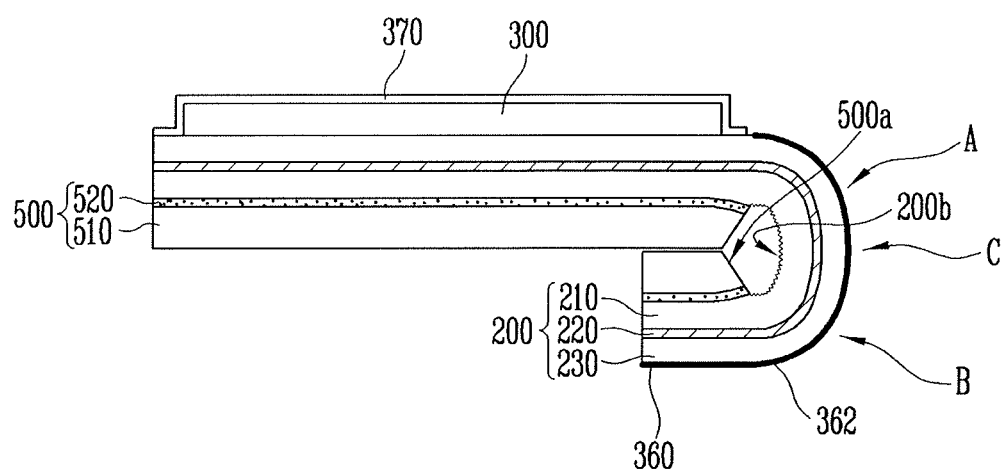
FIG. 5 illustrates a cross-sectional view illustrating a bending state of a display device according to an embodiment.

FIG. 5 illustrates a cross-sectional view showing a bending state of the display device according to an embodiment.

The display device according to the embodiment may be easily bent due to the presence of the groove 200b and the opening 500a.

The size (width) of the groove 200b may be controlled by the width of the laser beam L. The non-display region 260 may not be increased in order to secure the bending region.

The radius of curvature may be reduced by reducing the thickness of the second substrate 200 in the bending region by the formation of the groove 200b. The stress in portions A, B, and C where the stress is concentrated in the bending region may be reduced.

In addition, when bending is facilitated, the second substrate 200 may be easily bent and accommodated in a narrow space of a case, thereby effectively reducing the size of the display device.

By way of summation and review, flat panel display devices having flexibility are bendable or foldable, which is advantageous in reducing a size of the display devices and improving visibility at various angles. However, since the thickness of the display devices is small, defects may easily occur in a manufacturing process, a high manufacturing cost is required, and a lifetime of the display devices may be reduced due to stress caused by bending.

According to embodiments, a carbonized mark may be formed in the bending region of the substrate. When a opening is formed in the protecting film, the protecting film in the opening may be easily removed to form a groove due to the presence of the carbonized mark. The thickness of the substrate in the bending region may be reduced by forming the groove in the back surface of the substrate.

The process of forming the opening in the protecting film may be simpler than a general process. The production time and cost may be reduced, and the thickness of the substrate in the bending region may be reduced, such that the radius of curvature may be reduced and the stress due to bending may be reduced.

Further, the widths of the groove and the opening may be controlled by controlling the width of the laser beam. The increase of the non-display region caused by securing the bending region may be prevented. The substrate may be easily bent, and the size of the display device may be effectively reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:
1. A display device, comprising:
a flexible substrate including a display region and a non-display region, the non-display region being outside the display region; and
a display unit on the flexible substrate of the display region, wherein a groove is provided on a back surface of the flexible substrate, and
an inner surface of the groove is in a carbonized state.

2. The display device as claimed in claim 1, wherein the flexible substrate is made of an organic material.

3. The display device as claimed in claim 1, wherein the flexible substrate includes at least one organic layer and at least one inorganic layer.

4. The display device as claimed in claim 1, wherein the display unit includes:
a plurality of scan lines arranged in a first direction;
a plurality of data lines arranged in a second direction intersecting the first direction; and
a plurality of pixels connected to the plurality of scan lines and the plurality of data lines,
wherein each of the plurality of pixels includes:
a light emitting element; and
a thin film transistor connected to the light emitting element.

5. The display device as claimed in claim 1, wherein the carbonized state is produced by irradiating a laser beam onto the inner surface.

6. The display device as claimed in claim 1, wherein a depth of the groove is 3% to 10% of a thickness of the flexible substrate.

7. The display device as claimed in claim 1, further comprising:
a protecting film attached to the back surface of the flexible substrate, wherein
the protecting film includes an opening that exposes the groove.

8. The display device as claimed in claim 1, wherein the groove has an irregular surface due to carbonization.

9. The display device as claimed in claim 1, wherein the carbonized state has a thickness of 3 µm to 5 µm.

10. The display device as claimed in claim 1, wherein the carbonized state has a thickness greater than 0.3 µm.

11. A manufacturing method of a display device, the method comprising:
providing a first substrate;
forming a second substrate including a display region and a non-display region on the first substrate, the non-display region being formed to be outside the display region;
forming a display unit on the second substrate in the display region;
forming a carbonized mark by irradiating a laser beam to a predetermined region of a back surface of the second substrate;
separating the first substrate from the second substrate;
attaching a protecting film to the back surface of the second substrate; and
cutting the protecting film corresponding to both side portions of the carbonized mark,
wherein in cutting the protecting film, a cut portion of the protecting film is detached with the carbonized mark to form a groove on the back surface of the second substrate, and an opening is formed in the protecting film to expose the groove.

12. The manufacturing method of the display device as claimed in claim 11, wherein the first substrate is a glass substrate.

13. The manufacturing method of the display device as claimed in claim 11, wherein the second substrate is formed of an organic material.

14. The manufacturing method of the display device as claimed in claim 11, wherein the second substrate is formed by laminating at least one organic layer and at least one inorganic layer.

15. The manufacturing method of the display device as claimed in claim 11, wherein separating the first substrate includes irradiating the laser beam onto the back surface of the second substrate through the first substrate.

16. The manufacturing method of the display device as claimed in claim 15, wherein forming the carbonized mark on the back surface of the second substrate is performed after separating the first substrate.

17. The manufacturing method of the display device as claimed in claim 11, wherein the protecting film includes an adhesive layer adhered to the second substrate, and the method further includes detaching and removing a portion of the adhesive layer corresponding to the groove with the carbonized mark.

18. The manufacturing method of the display device as claimed in claim 11, wherein the laser beam has a wavelength of 300 nm to 400 nm.

19. A display device, comprising:
a flexible substrate including a display region and a non-display region, the non-display region being outside the display region; and
a display unit on the flexible substrate of the display region, wherein
a groove is provided on a back surface of the flexible substrate, and
a depth of the groove is 3% to 10% of a thickness of the flexible substrate.

20. The display device as claimed in claim 19, wherein the flexible substrate includes at least one organic layer and at least one inorganic layer.

* * * * *